United States Patent
Bieri et al.

(10) Patent No.: US 7,567,081 B2
(45) Date of Patent: Jul. 28, 2009

(54) MAGNETIC RESONANCE NON-BALANCED-SSFP METHOD FOR THE DETECTION AND IMAGING OF SUSCEPTIBILITY RELATED MAGNETIC FIELD DISTORTIONS

(75) Inventors: Oliver Bieri, Liestal (CH); Klaus Scheffler, Basel (CH)

(73) Assignee: University of Basel, Basel (CH)

( * ) Notice: Subject to any disclaimer, the term of this patent is extended or adjusted under 35 U.S.C. 154(b) by 0 days.

(21) Appl. No.: 11/743,712

(22) Filed: May 3, 2007

(65) Prior Publication Data

US 2008/0272774 A1 Nov. 6, 2008

(51) Int. Cl.
*G01V 3/00* (2006.01)
*A61B 5/055* (2006.01)

(52) U.S. Cl. .............. 324/309; 324/310; 324/307; 324/314; 324/300; 600/410

(58) Field of Classification Search ......... 324/300–322; 600/407–435
See application file for complete search history.

(56) References Cited

U.S. PATENT DOCUMENTS

| | | | | |
|---|---|---|---|---|
| 4,449,097 A | * | 5/1984 | Young et al. | 324/309 |
| 5,125,407 A | * | 6/1992 | Harms et al. | 600/410 |
| 5,251,628 A | * | 10/1993 | Foo | 600/413 |
| 6,271,665 B1 | * | 8/2001 | Berr et al. | 324/306 |
| 6,624,630 B1 | * | 9/2003 | Foxall | 324/307 |
| 6,806,709 B2 | * | 10/2004 | Markl et al. | 324/307 |
| 7,046,004 B2 | * | 5/2006 | Bieri et al. | 324/307 |
| 7,106,060 B2 | * | 9/2006 | Hennig | 324/309 |
| 7,259,558 B2 | * | 8/2007 | Bieri et al. | 324/309 |
| 7,265,547 B2 | * | 9/2007 | Vu | 324/309 |
| 7,439,738 B2 | * | 10/2008 | Pines et al. | 324/307 |
| 2004/0113613 A1 | * | 6/2004 | Markl et al. | 324/306 |
| 2004/0162483 A1 | * | 8/2004 | Kimura | 600/419 |
| 2005/0245812 A1 | * | 11/2005 | Kim et al. | 600/410 |
| 2005/0258829 A1 | * | 11/2005 | Bieri et al. | 324/307 |
| 2006/0020403 A1 | * | 1/2006 | Pusiol | 702/45 |
| 2006/0152219 A1 | * | 7/2006 | Bieri et al. | 324/309 |
| 2006/0161060 A1 | * | 7/2006 | Pai | 600/431 |
| 2007/0063701 A1 | * | 3/2007 | Vu | 324/307 |
| 2007/0194788 A1 | * | 8/2007 | Pines et al. | 324/307 |
| 2007/0249929 A1 | * | 10/2007 | Jeong et al. | 600/410 |
| 2008/0081987 A1 | * | 4/2008 | Miyazaki | 600/410 |
| 2008/0272774 A1 | * | 11/2008 | Bieri et al. | 324/300 |

OTHER PUBLICATIONS

Seppenwoolde, et al., "Passive Tracking Exploiting Local Signal Conservation: The White Marker Phenomenon," Magnetic Resonance in Medicine, vol. 50, 2003, pp. 784-790.

Mekle, et al., "A Polymer-Based MR-Compatible Guidewire: A Study to Explore New Prospects for Interventional Peripheral Magnetic Resonance Angiography (ipMRA)," Journal of Magnetic Resonance Imaging, vol. 23, 2006, pp. 145-155.

* cited by examiner

*Primary Examiner*—Brij B. Shrivastav
*Assistant Examiner*—Tiffany A Fetzner
(74) *Attorney, Agent, or Firm*—Joyce von Natzmer; Pequignot + Myers LLC

(57) ABSTRACT

Disclosed are methods and apparatuses for generating susceptibility-related contrast images, as induced, e.g., by marker material interventional devices used for passive MR-guided interventions, or by particles or cells loaded with marker materials used for molecular imaging, cell-tracking or cell-labeling. Near a local magnetic field perturber a positive contrast signal emanates from local gradient compensation to form, e.g., a balanced SSFP type of echo, whereas everywhere else echoes are shifted outside of the data acquisition window.

15 Claims, 6 Drawing Sheets

MAGNETIC RESONANCE NON-BALANCED-SSFP METHOD FOR THE DETECTION AND IMAGING OF SUSCEPTIBILITY RELATED MAGNETIC FIELD DISTORTIONS

FIELD OF THE INVENTION

This invention relates to methods and apparatuses for imaging susceptibility-related magnetic field distortions as induced, e.g., by marker materials of interventional devices or of loaded particles or cells. In certain embodiments, the invention relates to methods and apparatuses for generating a positive signal from such local magnetic field distortions over the background for tracking and/or visualizing interventional devices during magnetic resonance imaging (MRI) scanning or for visualizing and/or detecting local field inhomogeneities produced, e.g., by iron loaded particles or cells.

BACKGROUND OF THE INVENTION

Susceptibility-induced contrasts resulting from marker materials, such as paramagnetic materials, have gained increasing interest in MRI due to their far reaching applications. These applications include, but are not limited to, cell-tracking, molecular imaging or, in interventional MRI, guidance of devices marked by, e.g., paramagnetic materials. As a result, many different methods have been proposed to generate susceptibility-related NMR image contrast. Generally, these methods are either based on negative (signal loss) or positive (signal gain) contrasts, that is, MR imaging sequences that either decrease or increase signals at susceptibility-related field distortions over background signals, that is, signals in the far-field of the magnetic field perturber.

Local magnetic field distortions, however, do not only arise from marker materials but also from susceptibility differences between tissues (e.g. air-cavities, bone tissue interface, etc.), that is, in regions that are typically far from the iso-center of the main magnetic field. Thus, discrimination of susceptibility-related contrast signals resulting from marker materials (wanted) and from other materials in the background (unwanted) is a challenging task. State-of-the-art methods often suffer from unwanted background signal enhancements that limit their practical use for MR-guided clinical interventions, cell tracking and/or molecular imaging. In particular, those unwanted background signal enhancements lead to false-positives what may have a considerable negative impact on patient safety.

In view of the above, it is apparent that there exists a need in the art for imaging methods and/or apparatuses which solve or at least ameliorate the above drawback of background signal discrimination of the prior art. It is a purpose of this invention to fulfill this need in the art as well as other needs which will become more apparent to the skilled artisan once given the following disclosure.

SUMMARY OF THE INVENTION

Generally speaking, this invention fulfills the above described needs in the art by furnishing a method of magnetic resonance imaging (MRI) comprising:
providing a non-balanced steady state fee precession (SSFP) protocol in which spins are dephased so that signal(s) are suppressed in an MRI image,
subjecting material having magnetic susceptibility to said non-balanced SSFP protocol, wherein said material causes a local magnetic field distortion generating local field gradients,
wherein said local field gradients compensate for said dephased spins locally so that said dephased spins are rephased to provide a local signal.

The signal may be a hyperintense positive signal. The protocol may be a non-balanced SSFP sequence and the rephased spins may result locally in a balanced SSFP. The spins within one TR may be dephased by $\pi$ or about $\pi$ or multiples thereof, but are, in a preferred embodiment, dephased by $2\pi$ or about $2\pi$ or a multiple thereof, e.g., by $4\pi$ or about $4\pi$.

The dephasing may occur along the readout gradient (Gx), the phase encode gradient (Gy), the slice selection gradient (Gz) or a combination thereof. The local field gradients may, in certain embodiments, fully compensate for the dephased spins. The material having magnetic susceptibility may be a diamagnetic, paramagnetic or a ferromagnetic material. The MRI image may be one dimensional, two dimensional or three dimensional.

The material having magnetic susceptibility may be in a confined area and said non-balanced SSFP protocol may be a transient non-balanced SSFP phase. A signal may be detected after the material having magnetic susceptibility has been subjected to one to ten excitation pulses of said transient non-balanced SSFP phase. The signal may be created within about 1 to 30 milliseconds, preferably within about 1 to 25 milliseconds, more preferably within about 1 to 20 milliseconds, about 1 to 15 milliseconds or about 1 to 10 milliseconds. The material having magnetic susceptibility may be part of a moving local magnetic field perturber and a projection image of said moving local magnetic field perturber may be created.

DETAILED DESCRIPTION OF VARIOUS AND PREFERRED EMBODIMENTS

For a more complete understanding of the present invention and advantages thereof, references is now made to the following description of various illustrative and non-limiting embodiments thereof, taken in conjunction with the accompanying drawings in which like reference numbers indicate like features.

Magnetic resonance imaging, hereinafter "MRI" (and more generically referred to as nuclear magnetic resonance imaging or "NMR"), is a method of generating images which utilizes the detection of the relaxation properties of excited atomic nuclei then exposes the nuclei to pulses of electromagnetic energy (excitation/gradient pulses, radio frequency or "RF" pulses) in order to force the nuclei to temporarily assume non-aligned, higher energy states. In such methodologies, changes in energy states, as they are effected by the application of magnetic and RF fields, are measured and/or detected and then assimilated into images.

Although images produced by known MRI techniques are adequate in many applications, improvements in both, local magnetic field perturber signal versus background signal discrimination as well as image acquisition times are desirable.

Imaging methods may take advantage of a certain group of MR imaging sequences that generate contrast from susceptibility-related field distortions in the magnetic field. These field distortions may, e.g., be produced by small paramagnetic materials inserted into the magnetic field of a MRI apparatus, by interventional devices or via cells or particles loaded with paramagnetic materials. These imaging methods may be based on negative (signal loss) or positive (signal gain) contrast mechanisms, that is, MR imaging sequences that either decrease or increase signals at the susceptibility-related field distortion over background signal(s). Many prior art methods lack the ability to discriminate between susceptibility-related signals stemming from a local magnetic field perturber (also referred to herein just as "perturber")/marker materials (wanted) and susceptibility related contrast signal (s) from the background (unwanted).

Figure 1:
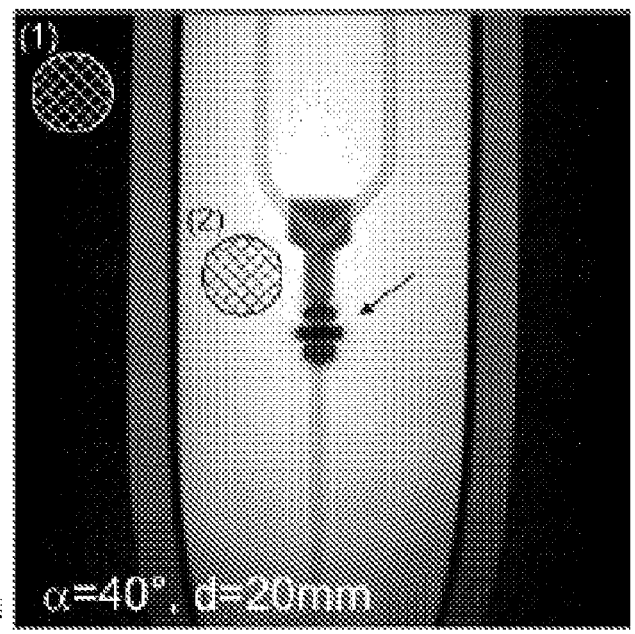
FIG. 1 illustrates a typical (a) negative contrast MRI image and (b) positive contrast MRI image of prior art methods.
Figure 1:
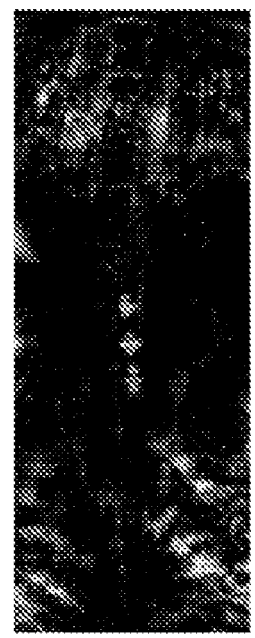

FIG. 1 illustrates examples of prior art SSFP (steady state free precession) based methods used for susceptibility related MRI image acquisitions which exhibit these drawbacks. In particular, FIG. 1(a) depicts a negative contrast method in which susceptibility-related field perturbations lead to signal voids, while FIG. 1(b) depicts a positive contrast method in which susceptibility-related field perturbations lead to positive signals. Whereas in (a) regions of low water content (air, as indicated by (1) or bones) may lead to lack of proper discriminability between signals from the background and from susceptibility-related magnetic field perturbations generated by an perturber, in (b) non-specific susceptibility related field perturbations lead to such a lack of proper discriminability. This lack interferes in particular with computer-aided, automatic or semi-automatic image postprocessing methods.

Figure 2:
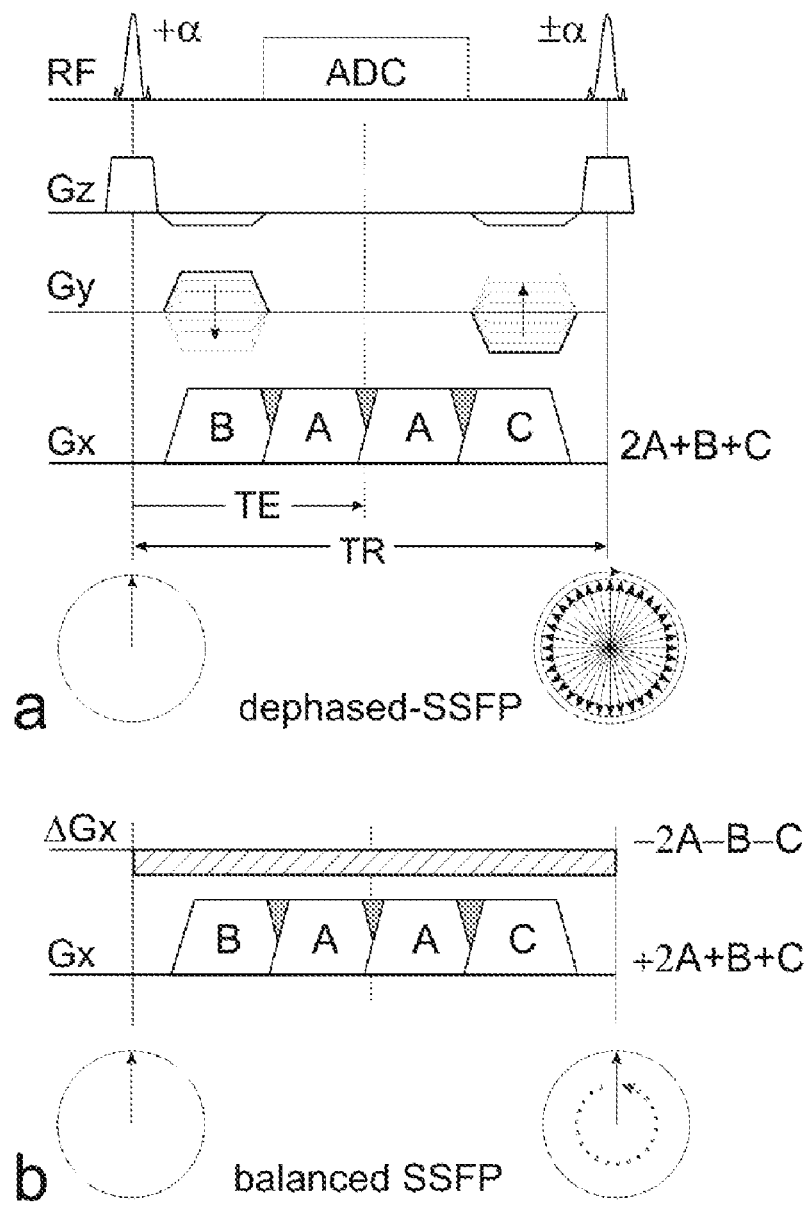
FIGS. 2(a) and (b) diagrammatically illustrates one embodiment of the method of the present invention for generating a positive contrast image due to local susceptibility changes.

Referring now to FIG. 2, this Figure shows one embodiments of the method of the present invention in which positive contrast is generated as a result of magnetic field distortions.

The Figure shows a pulse sequence diagram (PSD) for one embodiment of sequences used in the context of the present invention. Here, between consecutive excitation pulses, separated by a time interval (TR), acquisition, that is, in the context of the present invention, the process of measuring imaging data, is performed via switched gradient pulses along the readout (Gx), phase (Gy) and/or slice (Gz) direction. Under certain conditions (constant flip angle ($\alpha$), dephasing ($\theta$) and TR), a steady state of magnetization establishes itself after several TRs, termed steady-state free precession (SSFP). A SSFP sequence is usually established after about 50 TRs, about 100 TRs, about 150 TRs or about 200 TRs. The interval before a SSFP sequence is established, is referred to herein as transient SSFP phase. This transient SSFP phase and the subsequent SSFP sequence are commonly referred to herein as SSFP protocol. A balanced SSFP (b-SSFP) protocol describes a situation in which the gradient-induced dephasing within TR is exactly zero, that is, within TR each applied gradient pulse is compensated by a gradient pulse of opposite polarity. In an non-balanced SSFP (nb-SSFP) protocol, at least one of the applied gradient pulses, e.g., the read gradient (Gx), is not compensated, that is, gradient moments are not nulled. The term b-SSFP protocol, as used in the context of the present invention, refers to both b-SSFP sequences and transient b-SSFP phases, while the term nb-SSFP protocol refers to both nb-SSFP sequences and transient nb-SSFP phases. A transient SSFP phase, including a transient b-SSFP phase and/or a transient nb-SSFP phase may be terminated before a SSFP sequence, including a b-SSFP sequence and/or a nb-SSFP sequence, is established.

Figure 5:
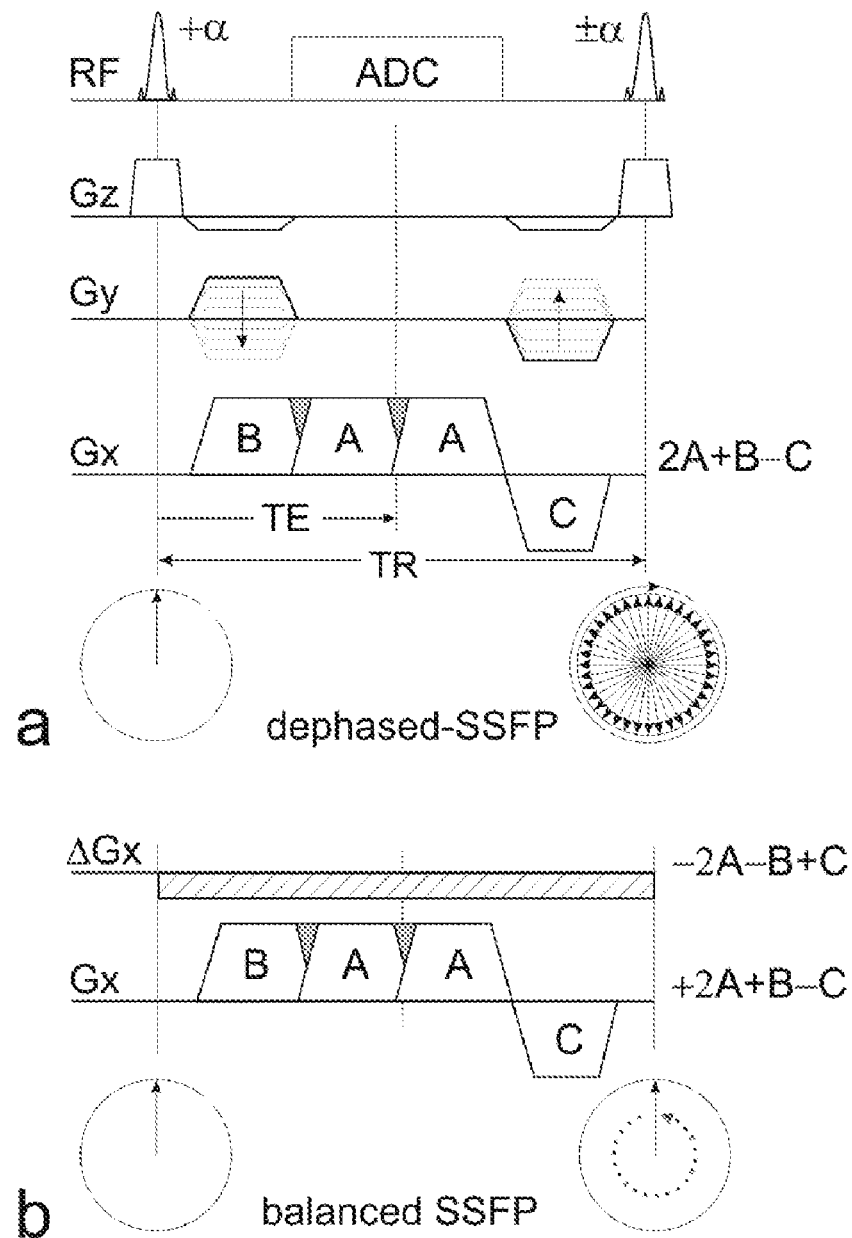
FIGS. 5(a) and (b) diagrammatically illustrates one embodiment of the method for generating a positive contrast image from local susceptibility changes. In this embodiment, only the primary echo is shifted outside the acquisition window.

In the context of the present invention, spins of such a nb-SSFP protocol are dephased so that signals are suppressed in an MRI image. The degree of signal suppression achieved will depend on the set up provided. For example, if only the primary echo is shifted outside the image acquisition window or image acquisition center (spin shift of $2\pi$ or about $2\pi$, e.g., $1.9\pi$ or $2.1\pi$), but subsequent echoes are refocused (rephased) as shown, for example, in FIG. 5, the degree of signal suppression is less than when, as in one of the preferred embodiment of the invention, the primary and subsequent echoes (spin shift of a multiple of $2\pi$ or about $2\pi$, preferably $4\pi$ or about $4\pi$) are shifted outside the image acquisition window or image acquisition center. Spin shifts included in the present invention start preferably at about $1\pi$ and may be, e.g., $2\pi$ or about $2\pi$, $3\pi$ or about $3\pi$, $4\pi$ or about $4\pi$, $5\pi$ or about $5\pi$ or multiples thereof. In a preferred embodiment, any signal will be suppressed creating consistent dark image. In certain embodiments, depending on the chosen spin shift, the flip angles ($\alpha$) and TRs may be adjusted to suppress signals (frequently referred to herein as "background signals") in said nb-SSFP protocol and to manipulate acquisition times. Accordingly, in certain embodiments of the present invention in which the spin shift is $2\pi$ or less, flip angles preferably range from about 1° to about 10°, more preferably from about 1° to about 5°, even more preferably from about 1° to about 3°. The respective TRs preferably range from about 5 ms to about 30 ms, more preferably from about 10 ms to about 25 ms, even more preferably from about 15 ms to about 20 ms. In further embodiments of the present invention in which the spin shift is $4\pi$ or more, flip angles preferably range from about 10° to about 90°, more preferably from about 20° to about 70°, even more preferably from about 30° to about 50°. The respective TRs preferably range from about 2 ms to about 10 ms, more preferably from about 2 ms to about 6 ms, even more preferably from about 2 ms to about 4 ms. In yet further embodiments of the present invention, in which the spin shift is between $2\pi$ and $4\pi$, flip angles and TRs may be chosen from any of these set of ranges, that is from about 1° to about 90° (flip angles) and about 2 ms to about 30 ms (TRs), e.g., flip angles may range from about 10° to about 70°, from about 10° to about 50° or from about 20° to about 50°, while TRs may, e.g., range from about 4 ms to about 25 ms, from about 4 ms to about 15 ms or from about 6 ms to about 15 ms, respectively. In certain embodiments, in which low acquisition times are desired, the person skilled in the art will know to choose the shortest TRs possible to accomplish the desired suppression, while keeping the flip angles relatively high to obtain good signal strength.

In yet another preferred embodiment, the signals created due to rephasing are hyperintense positive signals (also referred to herein just as "hyperintense signals"). A local hyperintense positive signal is a positive signal that is spatially confined and that can be distinguished from background signal(s), which may be caused by field distortions induced, e.g., by different tissues. In a preferred embodiment such a hyperintense signal has a contrast-to-noise-ratio (CNR), which is, the ratio of the signal intensity scaled against interferences from the background, of at least about 2, preferably at least about 3, more preferably at least about 4, at least about 5, more preferably about 10 or higher, about 15 or higher or about 20 or higher.

In certain embodiments of the present invention, material having magnetic susceptibility (MMS) are subjected to a nb-SSFP. Such MMS may be a diamagnetic, preferably a paramagnetic or a ferromagnetic material. In a preferred embodiment such a material is a ferromagnetic material including iron, cobalt or nickel based material. In a particularly preferred embodiment, the material is superparamagnetic iron oxide (SPIO) including, but not limited to, ultrasmall superparamagnetic iron oxide (USPIO) and materials traded under the trademarks Feridex®, Endorem™, GastroMARK®, Lumirem®, Sinerem® or Resovist®. Other materials that can be used in the context of the present invention include, but are not limited to, gadopentetate dimeglumine, gadoteridol, gadoterate meglumine or mangafodipir trisodium as well as alloys, such as iron-carbon alloys (e.g., stainless steal). A MMS that, when subjected to a nb-SSFP, causes a local magnetic field distortion resulting in rephrasing of local spins to provide a local signal is also referred to herein as "marker material." A object comprising such a marker material is referred to herein as a local magnetic field perturber or just perturber.

In one embodiment of the present invention, a marker material, e.g., an iron-carbon alloy such as stainless steel, is located at a guide wire. For example, the marker material may be embedded in the coating of such a guide wire and may, in certain embodiments, be concentrated at and/or confined to the tip or other areas of such a guide wire, e.g., confined to one, two, three, four or five places at the tip. The body of the guide wire may have a diameter of less than 2 mm or even less than 1 mm and may be 0.5 m, 1 m, 2 m or more in length. The body of the guide wire may preferably be made of material having lower magnetic susceptibility than the marker material. Biomaterials used for implants including thermoplastics such as polyetheretherketones (PEEK) and other polymeric materials are preferred in certain embodiments of the invention. The marker material of such a guide wire may generate a local magnetic field perturbation (magnetic field distortion) that is said to be in a "confined area." Such a guide wire may, for example, be used for MR guided interventions. Here the guide wire's movement can be followed by using the method described herein. Advantageously, local signals are, in certain embodiments of the invention, produced very rapidly, that is, within a matter of seconds, preferably milliseconds such as in less than about 30 milliseconds, less than about 20 milliseconds, less than about 15 milliseconds, less than about 10 milliseconds or less than about 5 milliseconds.

If, in the context of the present invention, it is said that the MMSs described herein are subjected to a nb-SSFP protocol, this means that the nb-SSFP protocol may be first established and the marker material/perturber is then introduced or that the marker material/perturber is first introduced into, e.g., an MRI apparatus, and the nb-SSFP protocol is subsequently applied. The later may, e.g., be the case, when projection images of a guide wire as described above are produced according to the present invention.

If, in the context of the present invention, field gradients are said to be local, these field gradients are confined in space. The local field gradients may compensate for dephased spins, and may in certain embodiments of the present invention, result locally in a b-SSFP. Such a b-SSFP may be distinguishable from a background in which the SSFP is not balanced (nb-SSFP). The b-SSPF creates a local signal that results in a contrast against the nb-SSFP background. More generically, local spin rephasing in a nb-SSFP protocol provides for a local signal that results in a contrast against the nb-SSFP background. This allows for, e.g., the visualization the marker material responsible for this rephasing.

A local field gradient is said to compensate for dephased spins if it reverses at least one point of the local magnetic field gradient, that describes the maximal compensation resulting from a marker material/perturber, the dephasing to more than about 50%. Preferably this compensation reaches an extent in which rephasing of such dephased spins create a local signal, preferably a hyperintense signal. In certain embodiments of the present invention, the compensation reaches at such a point of the local magnetic field gradient more than about 60%, more than about 70%, more than about 80% and preferably more than about 90%. A compensation that peaks at about 95% and more is referred to herein as full compensation. Local field gradients are said to compensate for dephased spins locally, if said compensation is confined in space.

Returning to the specific embodiment of FIG. 2, this Figure illustrates a method in which positive contrast is generated from spatially confined, that is, local, susceptibility-related magnetic field distortions using an non-balanced (nb) (unbalanced) steady-state free precession (SSFP) protocol. FIG. 2(a) depicts a nb-SSFP protocol as it may be applied in the present invention. This sequence scheme exists in the gross region of the image, that is, in a region in which the influence of the magnetic field distortion from the marker material is low. Echoes are shifted outside of the acquisition window (or of the acquisition window center) by the gradient moment B on the readout axis Gx, that is, spins in an imaging voxel are dephased, here by the amount 2A+B+C, prior to the next excitation. From FIG. 2(a) it can be inferred that any signal from the image background is destroyed prior to readout (of duration of gradients A+A) by shifting the echoes out of the data acquisition window (by the amount of A+B) for data collection. The spins within one imaging voxel are dephased prior to the next excitation, here by the amount of 2A+B+C. Strong local magnetic field distortions as induced by marker materials generate strong and spatially very much confined, ergo local, magnetic field distortions of complex patterns. At some given point P(x0,y0,z0), these field distortions can be formally captured by a frequency offset ($\Delta\omega$w) and a local field gradient ($\Delta$Gx(x0,y0,z0), $\Delta$Gy(x0,y0,z0) and $\Delta$Gz(x0, y0,z0)) that describes to a first approximation the change of the field with position (mathematically given by the spatial derivative of the field distortion). These local field gradients ($\Delta$Gx, $\Delta$Gy, $\Delta$Gz) compete with the global field gradients (Gx, Gy, Gz in FIG. 2A) as produced by the MRI apparatus, for example, for image encoding or spin dephasing. Thus, as shown in FIG. 2(b), in regions close to the marker materials, local magnetic field perturbations, indicated by $\Delta$Gx, compete locally for the sequence related dephasing (in Gx direction: 2A+B+C), to form a b-SSFP type of echo, that is, spins within an imaging voxel are completely rephased prior to the next excitation. FIG. 2(b) illustrates the local gradient field amplitude for a specific region (around a point P) of magnetic field perturbation, where the local gradient field ($\Delta$Gx) exactly compensates for the sequence related dephasing (of amount 2A+B+C). For this specific region, the sequence related dephasing pattern (for the background) is rephrased and a balanced SSFP type of sequence is formed locally. As a result a balanced SSFP type of echo is formed in this region yielding especially high signal amplitudes. In addition, higher order SSFP echoes, such as SSFP-FID or SSFP-echo, may be locally formed at a region (around point P1) of the gradient at a distance of P, as well, however, yielding significant lower signal amplitudes.

Figure 3:
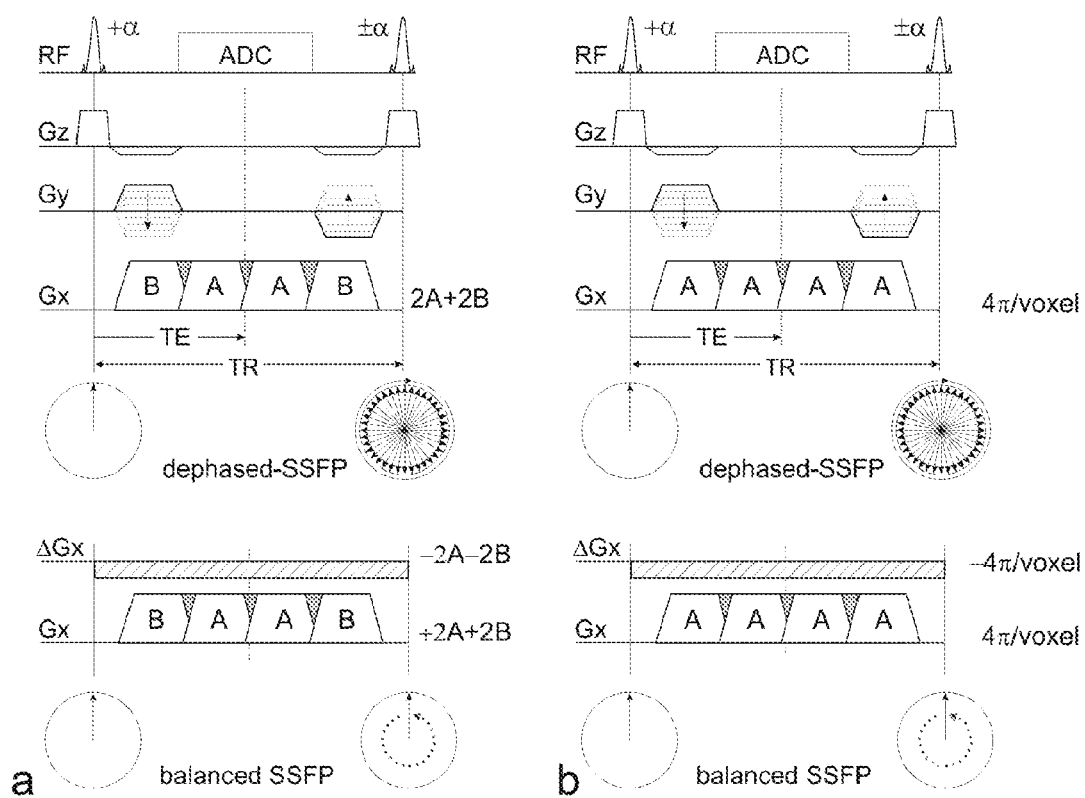
FIGS. 3(a) and (b) diagrammatically illustrates preferred embodiments of the method of the present invention for generating a positive contrast image from local susceptibility changes.

FIG. 3 shows a preferred embodiment of the present invention which is based on the embodiment of FIG. 2 is shown, but in which the spin dephasing is symmetric, that is, as shown in FIG. 3(a), B=C. The dephasing may amount to two times the dephasing during readout. As shown in FIG. 3(b), B=C=A, i.e., the spins within one imaging voxel are dephased by an amount of $4\pi$ prior to the next excitation.

Figure 4:
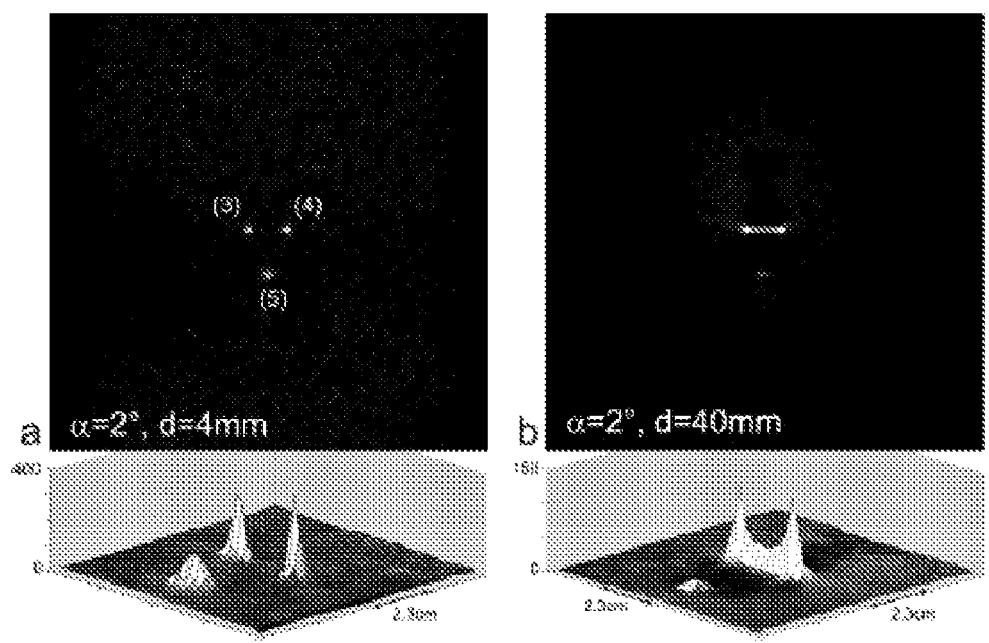
FIGS. 4(a) and (b) illustrate two versions of a positive contrast image of the embodiment of the invention as presented in FIG. 3(b). The overall set up equals the setup shown in FIG. 1(a).

Turning now to FIG. 4, this picture depicts images utilizing an preferred embodiment of the present invention. These images were generated by the protocol depicted in FIG. 3(b), while the experimental setup corresponds to the one shown in FIG. 1(a). As a result of the dephasing by $4\pi$, any background signal from the unperturbed magnetic field is fully suppressed (PDS as illustrated in FIG. 3(b), top, applies). However, regions of local gradient compensation result in hyperintense signals that can be clearly discriminated from the background (sequence scheme as illustrated in FIG. 3(b), bottom, applies locally). FIG. 4(a) shows a slice having a thickness of d=4 mm, while FIG. 4(b) shows a slice having a thickness of d=40 mm. Notably, if d is equal or greater than the expansion of the three dimensional perturber viewed into direction d, a two dimensional projection image, that is, an image providing information about the intensity of the signal, can be produced.

FIG. 5(a) depicts a sequence scheme that exists in the gross region of the image, that is, in regions in which the influence of the magnetic field perturbator/the marker material, is low. Here, due to a partial refocusing by gradient moment C, only the primary echo is shifted outside the acquisition window (or acquisition window center) by the gradient moment B on the readout axis Gx (by the amount B+A). Thus, higher order echoes are in the depicted embodiment of the invention partially refocused by the application of a refocusing gradient (of shape C) with a polarity reverse to the dephasing gradients (of shape A/B) prior to the next excitation. Spins in an imaging voxel are dephased in the shown embodiment by the amount 2A+B−C prior to the next excitation. As shown in (b), in regions of local magnetic field distortions, local field gradients, indicated by $\Delta Gx$, compete locally for the sequence related dephasing (in Gx direction: 2A+B−C), to form a b-SSFP type of echo, that is, spins within an imaging voxel are rephased prior to the next excitation.

Figure 6:
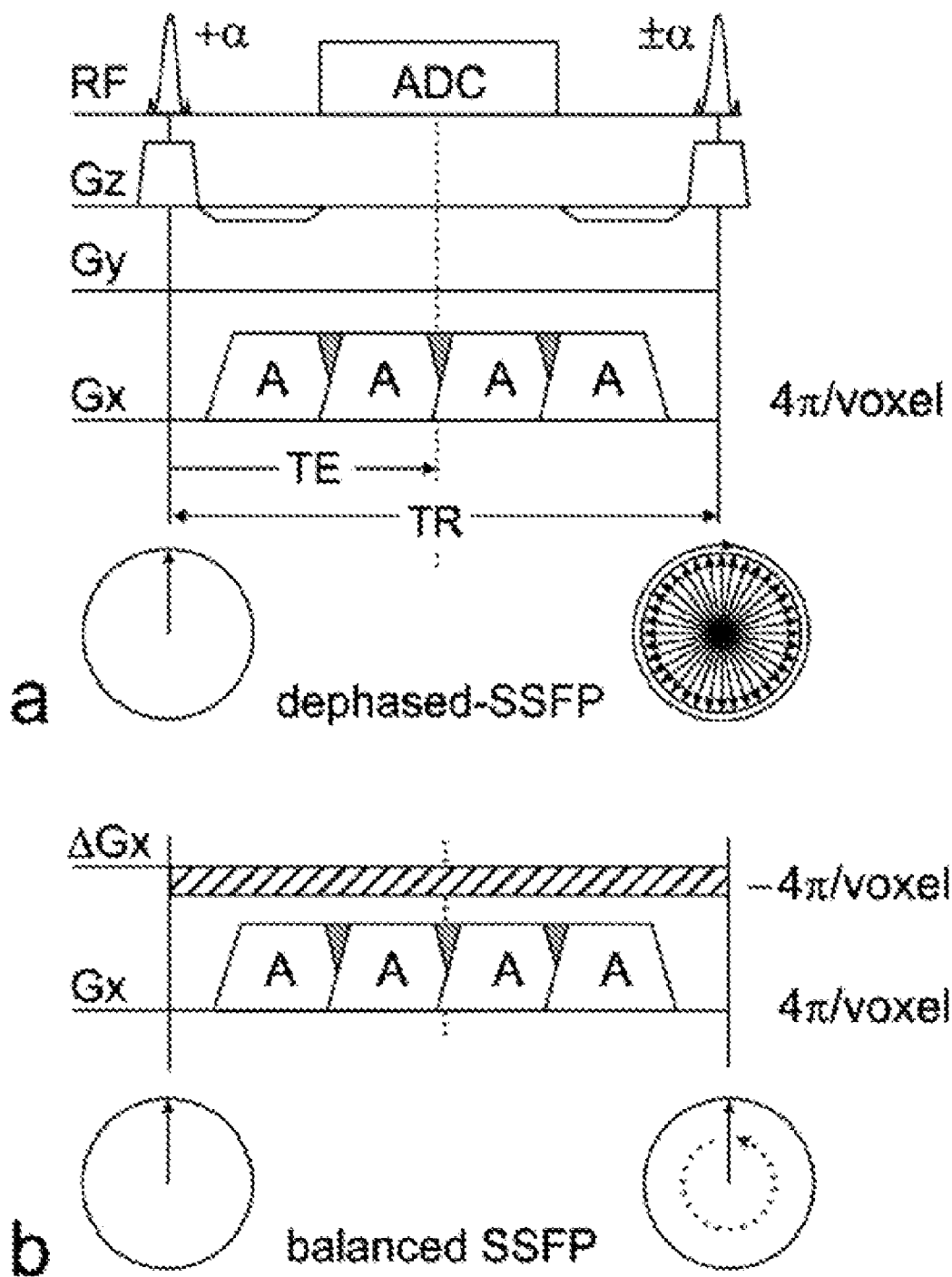
FIGS. 6(a) and (b) diagrammatically illustrates one embodiment of the method of the present invention generating a positive contrast projection image from local susceptibility changes.

FIG. 6 depicts another embodiment of the present invention. Here a transient nb-SSFP phase is applied to yield, due to local rephasing of spins, a projection image, that is, a projection of a signal along one direction, here along the Gx axis. This embodiment allows very fast localization of the position of a moving perturber, e.g., a guide wire comprising marker material. The resulting local magnetic field distortions can be visualized and thus the moving perturber can be localized, within less than 30 ms, preferably within less than 20 ms, within less than 15 ms, within less than 10 ms or within less than 5 ms.

The Figures described herein show embodiments in which dephasing and rephasing of spins occurs along the Gx axis. As the person skilled in the art will appreciate dephasing and or rephasing along the Gy axis, along the Gz axis or any combination of the three axes are equally possible and in certain instances desirable.

Employing the unique MRI imaging methods which are described above results in images which display improved positive contrast over a suppressed background due local gradient compensation, which is associated, in certain embodiment of the invention, with the formation of a b-SSFP type of echo. In many embodiments of the present invention, positive contrast-to-noise ratios of about a factor of 10 or higher can be achieved. Thus, certain embodiments of the invention described herein reduce or eliminate the inherent sensitivity of prior art methods to the background signal. High specificities and high contrast-to-noise ratios render this method highly useful for many specialized medical uses, such as, but not limited to, MR-guided interventions or the detection of iron-loaded particles. High specificities and high contrast-to-noise ratios render this method highly useful for automatic and semi-automatic image postprocessing methods, that is, computer aided algorithms that request no or only limited interaction with the user to reliably detect regions of interest.

Once given the above disclosure, many other features, modifications, and improvements will become apparent to the skilled artisan. Such other features, modifications, and improvements are therefore considered to be part of this invention, the scope of which is to be determined by the following claims.

We claim:

1. A method of magnetic resonance imaging (MRI) within a MRI apparatus comprising:
    providing a non-balanced (nb) steady state free precession (SSFP) protocol in which spins are in steady-state while the imaging gradient itself is non-balanced wherein spins are dephased so that signal(s) are suppressed in an MRI image,
    subjecting material having magnetic susceptibility to said non-balanced SSFP protocol wherein said material causes a local magnetic field distortion generating local field gradients,
    wherein said local field gradients generated from said material compensate for said dephased spins of the nb-SSFP locally so that said dephased spins of the nb-SSFP are rephased in order to provide a local signal from the material having magnetic susceptibility which is utilized in generating an MRI image from the MRI apparatus.

2. The method of claim 1, wherein said signal is a hyperintense positive signal.

3. The method of claim 1, wherein said protocol is a non-balanced SSFP sequence, wherein the rephased spins result locally in a balanced SSFP.

4. The method of claim 1, wherein the spins within one TR are dephased by $2\pi$ about $2\pi$ or a multiple thereof.

5. The method of claim 4, wherein the spins within one TR are dephased by $4\pi$ or about $4\pi$.

6. The method of claim 1, wherein said dephasing occurs along the readout gradient (Gx), the phase encode gradient (Gy), the slice selection gradient (Gz) or a combination thereof.

7. The method of claim 1, wherein said local field gradients fully compensate for said dephased spins.

8. The method of claim 3, wherein said local field gradients fully compensate for said dephased spins.

9. The method of claim 1, wherein said material having magnetic susceptibility is a diamagnetic, paramagnetic or a ferromagnetic material.

10. The method of claim 9, wherein said material is a ferromagnetic material.

11. The method of claim 1, wherein said MRI image is one dimensional, two dimensional or three dimensional.

12. The method of claim 1, wherein said material having magnetic susceptibility is in a confined area and wherein said non-balanced SSFP protocol is a transient non-balanced SSFP phase.

13. The method of claim 12, wherein a signal is detected after said material has been subjected to one to ten excitation pulses of said transient non-balanced SSFP phase.

14. The method of claim 13, wherein said signal is created within 1 to 30 milliseconds, preferably within 1 to 20 milliseconds.

15. The method of claim 14, wherein the material is part of a moving local magnetic field perturber and wherein a projection image of said moving local magnetic field perturber is created by the MRI apparatus.

* * * * *